(12) United States Patent
He et al.

(10) Patent No.: US 10,223,198 B2
(45) Date of Patent: Mar. 5, 2019

(54) ERROR RATE REDUCTION

(71) Applicant: Micron Technology, Inc., Boise, ID (US)

(72) Inventors: Deping He, Boise, ID (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/046,666

(22) Filed: Feb. 18, 2016

(65) Prior Publication Data

US 2017/0242747 A1 Aug. 24, 2017

(51) Int. Cl.
| | |
|---|---|
| *G06F 11/10* | (2006.01) |
| *G11C 29/52* | (2006.01) |
| *H03M 13/11* | (2006.01) |
| *H03M 13/15* | (2006.01) |
| *H03M 13/13* | (2006.01) |
| *H03M 13/00* | (2006.01) |
| *H04L 1/00* | (2006.01) |

(Continued)

(52) U.S. Cl.
CPC .......... *G06F 11/1068* (2013.01); *G11C 29/52* (2013.01); *H03M 13/1102* (2013.01); *H03M 13/13* (2013.01); *H03M 13/152* (2013.01); *H03M 13/1515* (2013.01); *H03M 13/6356* (2013.01); *G11C 2029/0411* (2013.01); *H03M 13/29* (2013.01); *H03M 13/2936* (2013.01); *H03M 13/2966* (2013.01); *H03M 13/356* (2013.01); *H04L 1/007* (2013.01); *H04L 1/0057* (2013.01); *H04L 1/0066* (2013.01); *H04L 2001/0098* (2013.01)

(58) Field of Classification Search
CPC ..... H04L 1/007; H04L 1/0057; H04L 1/0066; H04L 2001/0098; G06F 11/1068; H03M 13/2936; H03M 13/29; H03M 13/2966; H03M 13/356; H03M 13/1102; H03M 13/13; H03M 13/1515; H03M 13/152; H03M 13/6356; G11C 29/52; G11C 2029/0411

See application file for complete search history.

(56) References Cited

U.S. PATENT DOCUMENTS

| | | | |
|---|---|---|---|
| 5,384,787 A | 1/1995 | Yoshinaka | |
| 6,519,732 B1 * | 2/2003 | Li ..................... | H03M 13/2957 714/755 |

(Continued)

FOREIGN PATENT DOCUMENTS

TW  1506634 B  11/2015

OTHER PUBLICATIONS

International Search Report and Written Opinion from related international application No. PCT/US2017/015944, dated May 12, 2017, 12 pp.

(Continued)

*Primary Examiner* — April Y Blair
*Assistant Examiner* — Sazzad Hossain
(74) *Attorney, Agent, or Firm* — Brooks, Cameron & Huebsch, PLLC

(57) ABSTRACT

The present disclosure includes apparatuses and methods for error rate reduction. One example method comprises adding an amount of error rate reduction (ERR) data to an amount of received user data, and writing the amount of user data along with the amount of ERR data to a memory.

19 Claims, 5 Drawing Sheets

(51) Int. Cl.
*H03M 13/29* (2006.01)
*H03M 13/35* (2006.01)
*G11C 29/04* (2006.01)

(56) References Cited

U.S. PATENT DOCUMENTS

| | | | |
|---|---|---|---|
| 6,721,919 B1* | 4/2004 | Morioka | G11B 20/1833 |
| | | | 714/758 |
| 7,783,935 B2 | 8/2010 | Thayer | |
| 7,934,143 B1* | 4/2011 | Wu | G11B 20/1426 |
| | | | 714/769 |
| 8,055,982 B2 | 11/2011 | Mulligan | |
| 8,127,211 B2 | 2/2012 | Richard | |
| 8,130,544 B2 | 3/2012 | Chou et al. | |
| 8,533,564 B2 | 9/2013 | Yurzola et al. | |
| 8,656,255 B1 | 2/2014 | Nemazie et al. | |
| 8,887,022 B2 | 11/2014 | Hammerschmidt et al. | |
| 8,924,816 B2 | 12/2014 | Khan | |
| 2002/0147954 A1* | 10/2002 | Shea | H03M 13/098 |
| | | | 714/755 |
| 2003/0005385 A1* | 1/2003 | Stieger | H03M 13/35 |
| | | | 714/758 |
| 2003/0061551 A1* | 3/2003 | Kim | G11B 20/1866 |
| | | | 714/701 |
| 2003/0131304 A1 | 7/2003 | Li | |
| 2008/0282130 A1* | 11/2008 | Lee | H04L 1/0053 |
| | | | 714/758 |
| 2010/0166008 A1* | 7/2010 | Hashimoto | H04L 27/38 |
| | | | 370/458 |
| 2010/0275098 A1 | 10/2010 | Thayer | |
| 2013/0305120 A1* | 11/2013 | Torii | G06F 11/1008 |
| | | | 714/764 |
| 2014/0115427 A1* | 4/2014 | Lu | G06F 11/1048 |
| | | | 714/773 |
| 2014/0281825 A1 | 9/2014 | Nemazie et al. | |
| 2014/0337687 A1 | 11/2014 | Bennett | |
| 2015/0074487 A1* | 3/2015 | Patapoutian | G06F 11/1012 |
| | | | 714/758 |
| 2015/0205665 A1* | 7/2015 | Kuo | G06F 11/1048 |
| | | | 714/773 |
| 2016/0132387 A1* | 5/2016 | Yeh | G11C 29/52 |
| | | | 714/766 |
| 2016/0179617 A1* | 6/2016 | Lee | G06F 11/1072 |
| | | | 714/755 |

OTHER PUBLICATIONS

Office Action from related Taiwanese patent application No. 106105418, dated Nov. 20, 2017, 22 pp.
Second Office Action from related Taiwanese patent application No. 106105418, dated Apr. 12, 2018, 9 pp.
Third Office Action from related Taiwanese patent application No. 106105418, dated Oct. 26, 2018, 22 pp.

* cited by examiner

ERROR RATE REDUCTION

TECHNICAL FIELD

The present disclosure relates generally to semiconductor memory apparatuses and methods, and more particularly, error rate reduction associated with memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption, relative to various other memory devices.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

A state of a flash memory cell can be determined by sensing the stored charge on the charge storage structure (e.g., the Vt) of the cell. However, a number of mechanisms, such as read disturb, program disturb, cell-to-cell interference, and/or charge loss (e.g., charge leakage), for example, can cause the Vt of the memory cell to change. Error correction code (ECC) schemes such as, a low-density parity-check (LDPC), Bose-Chaudhuri-Hocquenghen (BCH) and Reed-Solomon (RS) have been used to correct those errors; however, such ECC schemes typically have a limited error correction capability. For instance, various ECC schemes are incapable of error correction beyond a threshold bit error rate (BER). As such, an increase in the quantity of bit errors associated with a particular amount of data can result in the BER exceeding the capability of the ECC scheme, resulting in an uncorrectable ECC error, which can lead to loss of data, for instance.

DETAILED DESCRIPTION

Figure 1:
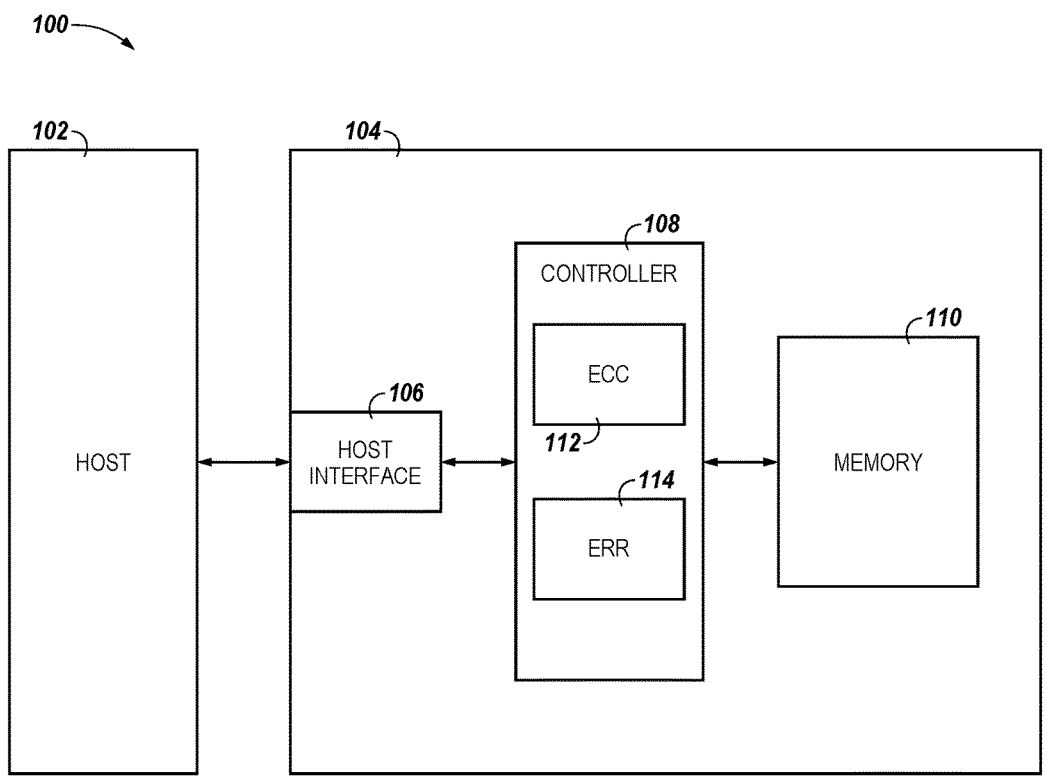
FIG. 1 is a block diagram of an apparatus in the form of a computing system including a memory system capable of error rate reduction in accordance with a number of embodiments of the present disclosure.

The present disclosure includes apparatuses and methods for error rate reduction associated with memory. One example method comprises adding an amount of error rate reduction (ERR) data to an amount of received user data, and writing the amount of user data along with the amount of ERR data to a memory.

Embodiments of the present disclosure can provide benefits such as increasing the likelihood that an error rate (e.g., bit error rate) associated with the memory does not exceed the correction capability of a particular ECC scheme, for instance. As an example, consider a group of memory cells (e.g., a physical page of cells, block of cells, etc.) whose associated bit error rate exceeds the capability of a particular ECC scheme such that a read operation results in an uncorrectable error (e.g., the quantity of erroneous bits in the read data exceeds the quantity of bits correctable by the ECC scheme). A number of embodiments of the present disclosure can reduce the effective bit error rate associated with the group of memory cells such that a subsequent read operation performed on the group of memory cells may not result in an uncorrectable error. Preventing the error rate from exceeding the correction capability of an ECC scheme can provide benefits such as increasing the performance, reliability, and/or lifetime of the memory, among other benefits. For example, portions of a memory (e.g., pages, blocks, etc.) may be retired from use once an associated bit error rate exceeds a particular threshold. However, embodiments of the present disclosure may prolong the use of such portions of memory by reducing the effective associated bit error rate, which can prevent retirement the memory portions. Lowering the effective error rate associated with a group of cells such that it does not exceed an error correction capability of an ECC scheme (e.g., a particular ECC scheme implemented by a controller) also can improve the reliability of the memory by reducing uncorrectable ECC errors, for instance.

As described further herein, error rate reduction (ERR) data refers to a quantity of data units (e.g., bits) having known data values (e.g., binary "0" or "1") and which are added to an amount of user data in order to reduce an effective error rate associated with memory in accordance with embodiments described herein. In a number of embodiments, the ERR data can replace a corresponding amount of user data within a page, thereby reducing the amount of user data corresponding to the page while maintaining a particular page size associated with the memory.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory system 104 capable of error rate reduction in accordance with a number of embodiments of the present disclosure.

As used herein, a memory system 104, a controller 108, or a memory device 110 might also be separately considered an "apparatus." The memory system 104 can be a solid state drive (SSD), for instance, and can include a host interface 106, a controller 108 (e.g., a sequencer and/or other control circuitry), and a number of memory devices 110, which can be referred to as memory 110. The memory 110 can comprise, for instance, a number of solid state memory devices such as NAND flash devices, which provide a storage volume for the memory system 104.

The controller 108 can be coupled to the host interface 106 and to the memory 110 via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

Although not specifically illustrated, the controller 108 can include a discrete memory channel controller for each channel coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

As illustrated in FIG. 1, the controller 108 can include an error correction component 112 (shown as "ECC") and an error rate reduction component 114 (shown as ERR). The error correction component 112 can include, for example, an algebraic error correction circuit such as one of the group including a Bose-Chaudhuri-Hocquenghem (BCH) error correction circuit and a Reed-Solomon error correction circuit, among other types of error correction circuits. The component 112 is not limited to circuitry (e.g., hardware) implementations. For instance, the component 112 can be implemented in hardware, firmware, and/or software. Also, component 112 is not limited to a particular type of error correction scheme. For example, component 112 can be an LDPC component, among various other types of ECC components. Although referred to as an error correction component, component 112 can be used to detect, as well as to correct, data errors. Additionally, component 112 can include error encoding and decoding functionality as described further below. For example, in a number of embodiments, the ECC component 112 can encode (e.g., with ECC data) a combined amount of user data and ERR data to be written to memory 110.

The ERR component 114 can include, for example, circuitry configured to encode user data with ERR data, as described further herein. For instance, component 114 can replace, with ERR data, a particular amount of user data corresponding to a page size. As an example, the component 114 can be configured to distribute the amount of ERR data among the amount of user data (e.g., user data received from a host 102). Since the ERR data comprises known data unit values at known locations within the page, the component 114 can also be configured to determine those data units having incorrect values once they are read from memory 110, and to correct those data units determined to be incorrect. As described further below, in a number of embodiments, the component 114 can be configured to correct those data units of the ERR data determined to be incorrect prior to performing an ECC decode operation on the page of data. As such, in a number of embodiments, the ERR data is corrected (e.g., by component 114) prior to undergoing an ECC decode operation along with the corresponding user data (e.g., via component 112). The component 114 is not limited to circuitry (e.g., hardware) implementations. For instance, the component 114 can be implemented in hardware, firmware, and/or software.

Figure 5:
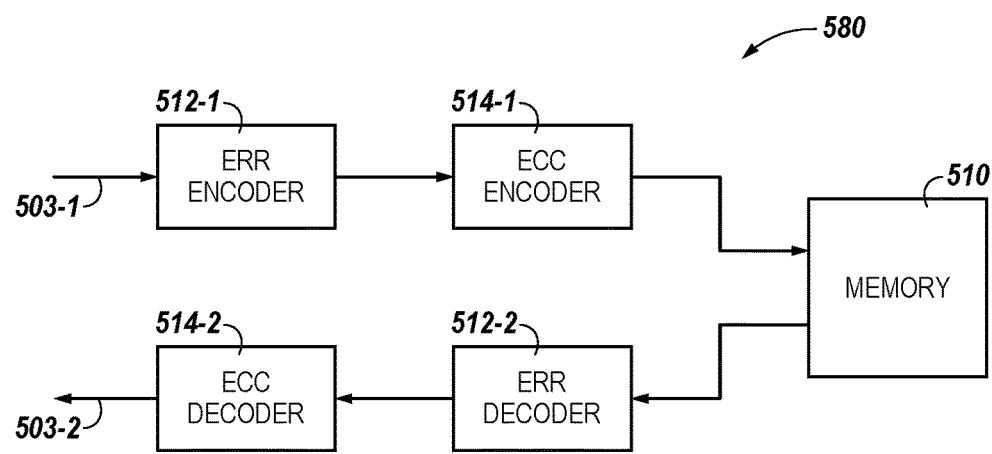
FIG. 5 is a functional block diagram of a portion of an apparatus associated with error rate reduction in accordance with a number of embodiments of the present disclosure.

The ECC component 112 and the ERR component 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, the ECC component 112 and the ERR component 114 can be external to the controller 108 or can have a number of components located within the controller 108 and a number of components located external to the controller 108. As illustrated in FIGS. 5, the ECC component 112 and the ERR component 114 can comprise separate encoding and decoding components, in a number of embodiments.

The memory 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory 110 as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

Figure 2:
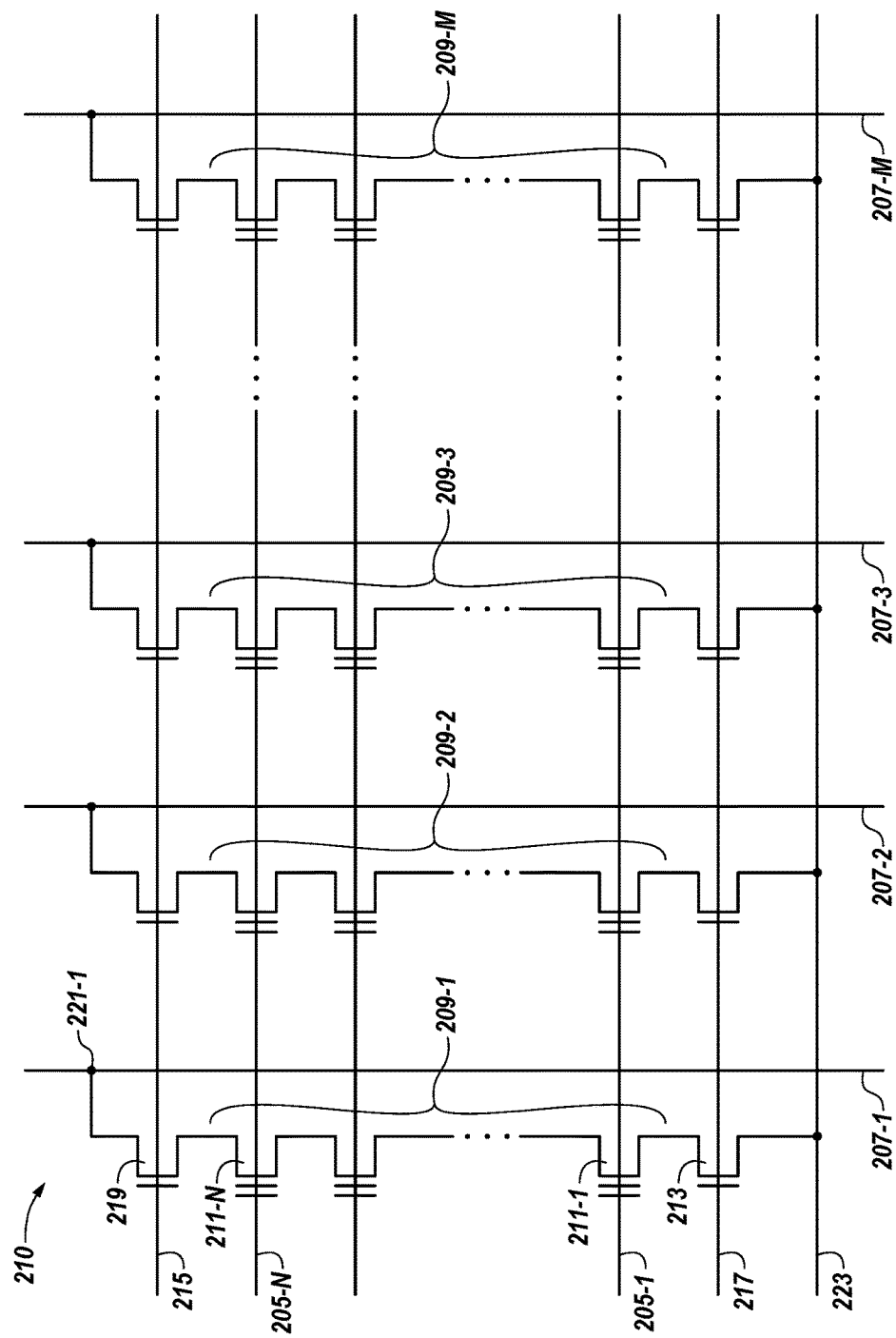
FIG. 2 is a schematic of a portion of a memory comprising an array of memory cells operable in accordance with a number of embodiments of the present disclosure

FIG. 2 is a schematic of a portion of a memory 210 comprising an array of memory cells operable in accordance with a number of embodiments of the present disclosure. The embodiment of FIG. 2 illustrates a NAND architecture non-volatile memory array; however, embodiments described herein are not limited to this example. As shown in FIG. 2, the memory array includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

In operation, a number of cells coupled to a selected word line (e.g., 205-1, . . . , 205-N) can be written and/or read together as a group. A group of cells written and/or read together can be referred to as a page of cells (e.g., a physical page) and can store a number of pages of data (e.g., logical pages). For instance, as described further below in association with FIG. 3, the memory cells 211-1, . . . , 211-N can be multilevel cells configured to store more than one digit (e.g., bit) of data. In some such instances, the bits stored in each multilevel cell can correspond to different logical pages of data. For example, a first bit of a 2-bit cell may correspond to a first logical page of data (e.g., a lower page), and a second bit of the 2-bit cell may correspond to a second logical page of data (e.g., an upper page). Cells storing more than two bits per cell may comprise a first bit corresponding to a lower page of data, a second bit corresponding to an upper page of data, and one or more additional bits corresponding to one or more middle pages of data. A number of cells coupled to a particular word line and programmed together to respective data states can be referred to as a target page. A programming operation can include applying a number of program pulses (e.g., 16V-20V) to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
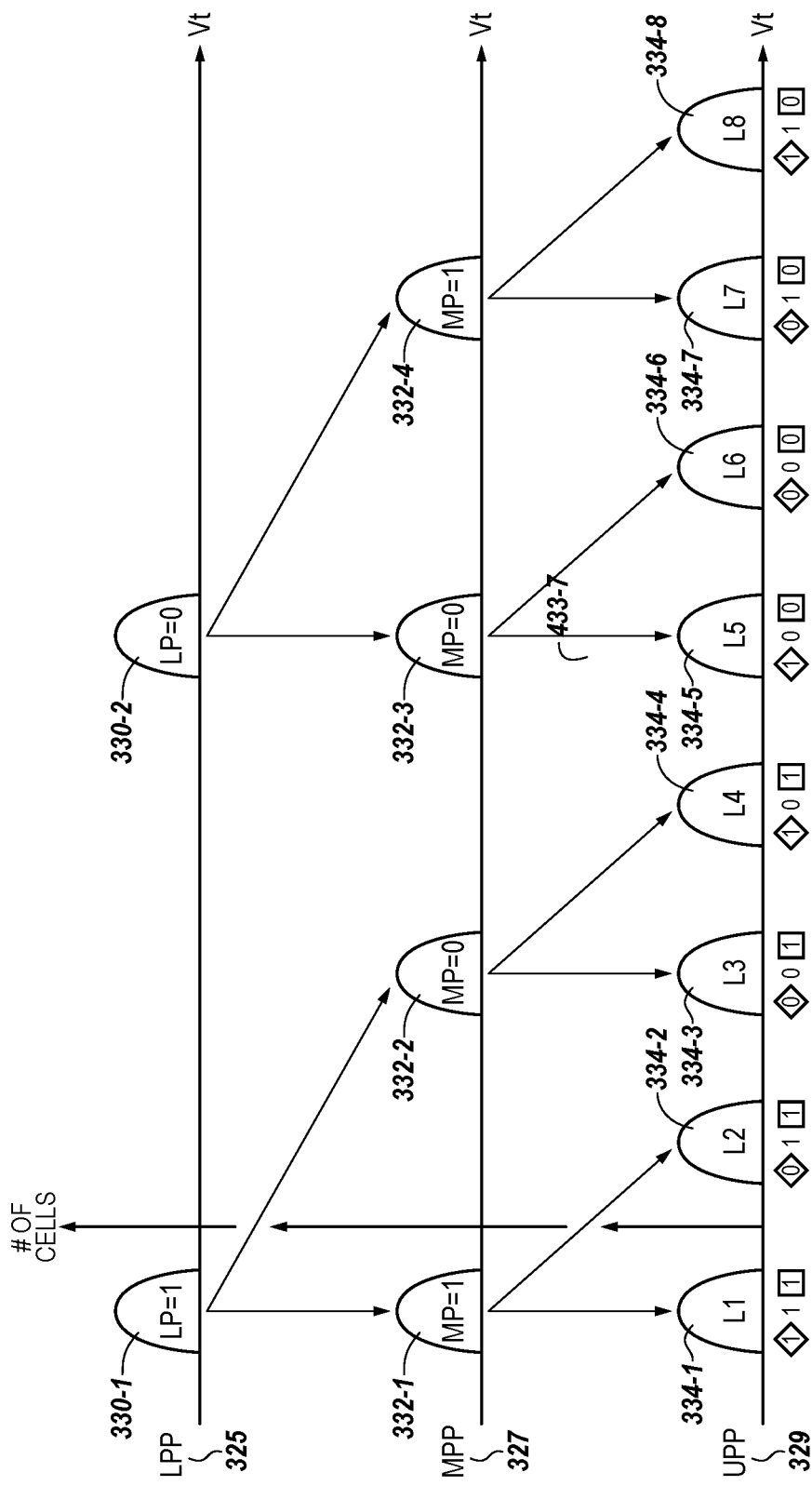
FIG. 3 illustrates a diagram associated with programming memory cells in accordance with a number of embodiments of the present disclosure

FIG. 3 illustrates a diagram associated with programming memory cells in accordance with a number of embodiments of the present disclosure. In this example, the memory cells are 3-bit memory cells with each cell being programmable to one of eight data states (e.g., L1 to L8) each indicating a different 3-bit stored bit pattern (e.g., 111, 011, 001, 101, 100, 000, 010, and 110). In a number of embodiments, each of the bits in the 3-bit stored bit pattern corresponds to a different page of data. For instance, the least significant bit (LSB) (right most bit shown as boxed in FIG. 3) can correspond to a first page of data (e.g., a lower page of data), the middle bit can correspond to a second page of data (e.g., a middle page of data), and the most significant bit (MSB) (left most bit shown as surrounded by diamond symbol in FIG. 3) can correspond to a third page of data (e.g., an upper page of data). As such, a page of cells can store three pages of data, in this example.

However, embodiments are not limited to multilevel memory cells storing three bits of data. For instance, a number of embodiments can include memory cells configured to store more or fewer than three bits of data and/or a fractional number of bits of data. Also, embodiments are not limited to the particular bit values assigned to the data states L1 to L8.

The diagram shown in FIG. 3 illustrates threshold voltage (Vt) distributions of a number of cells after a lower page programming (LPP) process 325, a middle page programming (MPP) process 327, and an upper page programming (UPP) process 329. As one of ordinary skill in the art will appreciate, NAND flash memory cells can be erased prior to having new data programmed thereto.

As part of the LPP process 325, the Vt of the memory cells are adjusted (e.g., via programming pulses applied to a selected word line) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325.

As part of the MPP process 327, the Vt of the memory cells are adjusted to one of four levels represented by Vt distributions 332-1, 332-2, 332-3, and 332-4. In this example, cells whose middle page is to store a bit value of "1" (e.g., MP=1) are programmed to one of distributions 332-2 and 332-3 during MPP process 327, and cells whose middle page is to store a bit value of "0" (e.g., MP=0) are programmed to one of distributions 332-1 and 332-4 during MPP process 327.

As part of the UPP process 329, the Vt of the memory cells are adjusted to one of eight levels represented by Vt distributions 334-1 to 334-8, which correspond to data states L1 to L8, respectively, with each one of data states L1 to L8 indicating a different 3-bit stored bit pattern. In this example, cells programmed to data state L1 store data "111," cells programmed to data state L2 store data "011," cells programmed to data state L3 store data "001," cells programmed to data state L4 store data "101," cells programmed to data state L5 store data "100," cells programmed to data state L6 store data "000," cells programmed to data state L7 store data "010," and cells programmed to data state L8 store data "110."

In operation, the error rate (e.g., BER) associated with a group (e.g., physical page) of memory cells can be different for the different corresponding logical pages. For instance, the BER associated with an upper page of data may be higher than the BER associated with a lower page of data. In such instances, the BER of an upper page of data may exceed the error correction capability of the controller (e.g., controller 108 shown in FIG. 1), while the BER of a lower page and/or a middle page of data may not exceed the error correction capability of the controller. Accordingly, in a number of embodiments of the present disclosure, ERR data may be added to user data based on to which particular page of a plurality of pages the data is to be written. For instance, ERR data may be added to user data if the data is being written as an upper page of data, but may ERR data may not be added to user data if the data is being written as a lower page of data.

Figure 4A:
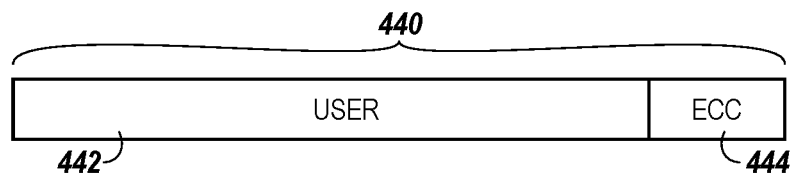
FIG. 4A illustrates a codeword comprising various types of data in accordance with previous approaches.
Figure 4B:
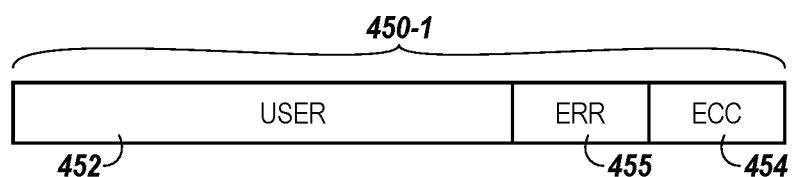
FIG. 4B illustrates a codeword comprising various types of data including ERR data in accordance with a number of embodiments of the present disclosure.
Figure 4C:
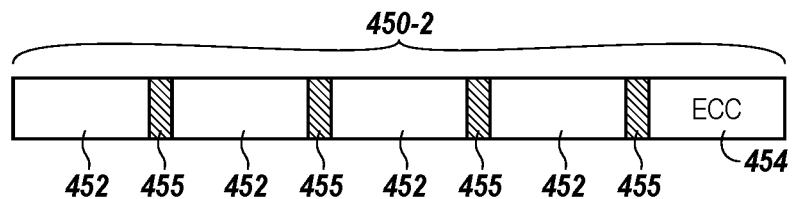
FIG. 4C illustrates a codeword comprising various types of data including ERR data in accordance with a number of embodiments of the present disclosure.

FIGS. 4A, 4B, and 4C illustrate codewords comprising various types of data. FIG. 4A illustrates a codeword 440 comprising various types of data in accordance with previous approaches. The example codeword 440 illustrated in FIG. 4A includes a "payload" comprising an amount of user data 442 and "wrapper" comprising an amount of error correction data 444 (e.g., ECC data) that error encodes (e.g., protects) the payload. The error correction data 444 can be an error correction code (e.g., LDPC code, BCH code, RS code, etc.). The user data 442 can be data to be written to a memory (e.g., 110) and which is received by a controller (e.g., controller 108) from a host (e.g., 102). The user data 442 can be error encoded with the error correction data 444 via an error correction component, which may be a component of a controller (e.g., component 112 of controller 108). The amount of user data 442 can correspond to a logical page size associated with a memory (e.g., memory 110 shown in FIG. 1, memory 210 shown in FIG. 2, etc.). As an example, user data 442 can correspond to a 2 KB page size, a 4 KB page size, or an 8 KB page size; however, embodiments are not limited to a particular page size. Although not shown in FIG. 4A, the payload of codeword 440 can include data in addition to user data 442. For instance, the payload of codeword 440 can include overhead data, such as metadata, associated with the user data 442.

As shown in FIGS. 4B and 4C, in a number of embodiments of the present disclosure, at least a portion of the amount user data 442 can be replaced with an amount of ERR data. The amount of user data to be replaced can be determined based on an number of factors, such as a BER associated with the memory to which the data is to be written, the type of page to which the data is to be written (e.g., upper page, lower page, etc.), a location of a particular word line to be written to within a block (e.g., word lines located nearer an edge may be prone to higher BER), and/or the age of the memory (e.g., the quantity or program/erase cycles), among other factors. For instance, FIG. 4B illustrates a codeword 450-1 comprising an amount of user data 452, an amount of ERR data 455, and an amount of error correction data 454. The error correction data 454 error encodes the user data 452 along with the ERR data 455. In a number of embodiments, the sum of the user data 452 and the ERR data 455 corresponding to codeword 450-1 can be equal to the amount of user data 442 corresponding to the codeword 440. As such, a particular codeword size can be maintained independent of the amount of ERR data 455. However, it is noted that replacing a portion of the amount of user data corresponding to a payload portion of a particular codeword reduces the amount of user data within the payload (in order to maintain the particular codeword size). For example, if the amount of user data 442 of codeword 440 corresponds to an 8 KB page size, and if the amount of ERR data 455 of codeword 450-1 is 2 KB, then the amount of user data 452 of codeword 450-1 is 6 KB, which is a reduction of user data by 2 KB (e.g., 8 KB-6 KB).

However, as described further herein, the addition of the ERR data (e.g., ERR data 455) to a codeword can reduce the effective error rate associated with the data. For instance, the ERR data 455 can be an amount of known data unit values, such as a number of known bit values or a number of groups of known bit values at various locations within the payload of a codeword. The data values of the ERR data, as well as their particular locations within the payload of a codeword can be tracked by an ERR component such as ERR component 114 shown in FIG. 1. As such, upon reading a particular codeword (e.g., 450-1) from memory, the ERR component (e.g., 114) can determine those data units of the ERR data 455 that are incorrect (e.g., those data units determined to have a value other than the predetermined known value, such as those bits that have flipped from a "0" to "1" or vice versa) and can correct those data units determined to be incorrect. In a number of embodiments, the ERR data 455 of a codeword read from memory can be corrected (e.g., via ERR component 114) prior to an error correction decode operation being performed on the payload (e.g., on the user data 455 and ERR data 455 via error correction component 112).

Performing the error correction decode operation subsequent to correcting any errors in the ERR data 455 effectively reduces the error rate associated with the payload. For instance, if the ERR data 455 comprises 25% of the payload (e.g., 2 KB of an 8 KB payload) and an 8 KB page has an average of 500 failing bits (corresponding to a BER of 0.76%), then correcting the ERR data 455 prior to performing the ECC error correction on the payload will result in an average of 375 failing bits for the 8 KB payload (corresponding to a BER of 0.57%), which is a 25% BER reduction. So, although the amount of user data corresponding to the payload is reduced (e.g., from 8 KB to 6 KB in this example), the quantity of bit errors corresponding to the user data 452 is reduced as compared to the quantity of bit errors corresponding to the user data 442 (e.g., from 500 to 375), which can provide an increased likelihood that the quantity of errors are correctable by a particular ECC component (e.g., ECC 112).

FIG. 4C illustrates a codeword 450-2 having a payload comprising an amount of user data 452 and an amount of ERR data 455, and a wrapper comprising error correction data 454. The sizes of portions 452, 455, 454 of the codeword 450-2 are the same as the sizes of the corresponding portions of codeword 450-1. However, codeword 450-2 illustrates the ERR data 455 being distributed among the user data 455. Embodiments are not limited to a particular amount of ERR data and/or to a particular distribution among the user data. For instance, the error data portions 455 may be distributed evenly among the user data 452; however, the error data 455 may be a series of adjacent bits located at a particular location within the payload (e.g., at the front, back, or middle). Also, embodiments are not limited to a particular data value for the ERR data 455 and/or to a particular data pattern. For instance, the data units of ERR data 455 can all have a same data value (e.g., all "1s" or all "0s"), or the data units of ERR data 455 can be a random data pattern.

In a number of embodiments, a controller (e.g., controller 108 described in FIG. 1) can be configured to determine the amount of ERR data (e.g., 455 illustrated in FIG. 4B and 4C) to be included in a particular codeword. For example, the controller can be configured to determine the amount of ERR data 455 based on a desired BER reduction percentage. The desired BER reduction percentage can be defined in relation to a page size of a memory (e.g., memory 110). For example, if the desired BER reduction percentage is 50% and the page size of the memory is 8 KB, the controller can determine the amount of ERR data 455 to be 4 KB (e.g., 50% of 8 KB). However, embodiments of the present disclosure are not limited to a particular method of determining the amount of ERR data 455. A number of methods associated with determining the amount of ERR data 455 will be further described in FIG. 5.

In a number of embodiments, the controller can be configured to write a codeword comprising ERR data (e.g., codeword 450-1/450-2) to a group of multilevel memory cells (MLCs). In some such embodiments, the controller can be configured to determine to which page (e.g., upper page, lower page, etc.) of the group of multilevel memory cells the codeword is to be written. In a number of embodiments, the controller can be configured to determine the amount of ERR data (e.g., 455) to be included in the codeword based on to which of the logical pages corresponding to a group of cells the codeword is to be written. For example, the controller can be configured to determine an error rate associated with the respective pages corresponding to the group of multilevel memory cells, and determine the amount of ERR data to be included in the codeword responsive to the determined error rates. As an example, the controller may determine that no ERR data is to be included in a particular codeword (e.g., if the corresponding determined error rate is within the correction capability of the error correction component).

FIG. 5 illustrates a functional block diagram of a portion of an apparatus 580 associated with error rate reduction in accordance with a number of embodiments of the present disclosure. The apparatus illustrated in FIG. 5 includes an error rate reduction 512-1 (ERR ENCODER), an error correction encoder 514-1 (ECC ENCODER), a memory 510, an error rate reduction decoder 512-2 (ERR DECODER), and an error correction decoder 514-2 (ECC DECODER).

The ERR encoder 512-1 can include, for example, circuitry configured to encode incoming user data (e.g., user data received from a host and to be written to memory 510) with an amount of ERR data (e.g., ERR data 455 shown in FIGS. 4B and 4C). As shown in FIG. 1, the ERR encoder can be a component of a controller (e.g., 108), which can determine whether to encode received user data with ERR data and, if ERR data is to be added, an amount of ERR data to add to the incoming user data (e.g., an amount of user data to be replaced by ERR data within a particular codeword). The ERR decoder 512-2 can include circuitry configured to decode ERR data within codewords read from memory 510. The ERR decoder 512-2 can know the data values and locations of the ERR data units within a codeword such that the ERR decoder 512-2 can determine whether any of the ERR data units within the codeword read from memory 510 are incorrect and can correct those data units determined to be incorrect. In a number of embodiments, the ERR data corresponding to a read codeword is decoded prior to the read codeword undergoing an error correction (e.g., ECC) decode operation (e.g., via ECC decoder 514-2), which can reduce an effective error rate associated with the codeword, as described herein.

The ECC encoder 514-1 can comprise an error correction circuit configured to encode data in accordance with a particular error correction code, such as a BCH code, an RS code, and an LDPC code, among other types of error correction codes. The ECC encoder 514-1 can, for instance, add parity bits to data received thereto (e.g., user data can ERR data). The ECC decoder 514-2 can decode data received thereto, and which may have already undergone ERR decoding via ERR decoder 512-2.

In FIG. 5, arrow 503-1 represents incoming data. For example, the incoming data 503-1 can be user data coming from a host (e.g., 102 described in FIG. 1). Although not shown, the ERR encoder 512-1 can include a buffer (e.g., a page buffer) configured to store an amount of data corresponding to a page size of the memory 510 (e.g., 8 KB) and which is to be written to the memory. In operation, if the ERR encoder 512-1 determines that an amount of ERR data is to be added to an amount of incoming user data, then the ERR encoder can be configured to fill the page buffer with an amount of user data that is less than the page size (e.g., less than 8 KB in this example) and to fill a remaining portion of the page buffer with corresponding amount of ERR data. As an example, the page buffer might be 75% filled with user data (e.g., 6 KB) and 25% filled with ERR data.

The determination of whether to encode incoming user data with ERR data can be based on various factors. For instance, the determination of whether to encode incoming user data with ERR data can be based on BER associated with the memory to be written to (e.g., 510) or a portion thereof (e.g., a BER associated with a particular block of cells, wordline, etc.). As an example, a controller (e.g., 108) can track BER(s) associated with memory 510, and can be configured to implement ERR data functionality responsive to a BER reaching or exceeding a threshold level. For instance, the threshold level can be based on an ECC capability of the error correction component (e.g., 112 or 514-1/514-2). In a number of embodiments, the determination of whether to encode incoming user data with ERR data can be based on a physical location of memory cells to which data is to be written. For instance, since wordlines at or near an edge of a block of memory cells can often experience higher BER, a determination to add ERR data can be made based on whether the wordline to be written to is located at or near an edge of an array.

The determination of the amount of ERR data to encode incoming user data with can also be based on various factors. For instance, the ERR encoder 512-1 can be configured to determine the amount of ERR data based on an error correction capability of the error correction encoder/decoder 514-1/514-2. For example, the amount of ERR data to be added can be determined based on the amount ERR data necessary to reduce the effective BER enough such that it meets or exceeds the ECC capability. As described above, in a number of embodiments, the amount of ERR data can be a particular (e.g., predetermined) percentage corresponding to a page size of the memory. However, embodiments are not limited to a particular method for determining the amount of ERR data with which to encode incoming user data. Subsequent to the amount of incoming user data being encoded with ERR data via ERR encoder 512-1, the ERR encoded data can be encoded with error correction data (e.g., ECC) via ECC encoder 514-1 to protect the codeword payload (e.g., the user data and ERR data). The ERR and ECC encoded codeword can then be written to memory 510 (e.g., to a page of memory),In a response to a read command, data read from memory 510 (e.g., a codeword comprising data encoded by the ERR encoder 512-1 and ECC encoder 514-1) can be decoded by the ERR decoder 512-2 and the ECC decoder 514-2. In accordance with a number of embodiments, the read codeword is decoded via ERR decoder 512-2 prior to being decoded by the ECC decoder 514-2. Upon the codeword being received by the ERR decoder 512-2, the ERR decoder 512-2 corrects those data units of the amount of ERR data determined to have incorrect data values. As described above, the ERR data comprises known data values at known locations within the codeword. As such, the ERR decoder 512-2 can automatically correct any ERR bits within the codeword that have flipped since being written to the memory. As an example, the ERR decoder 512-2 can store the known ERR data pattern in a buffer, can compare the known data pattern to the ERR data pattern read from memory 510, and can flip those ERR bits of the codeword determined to be incorrect prior to providing the ERR decoded codeword to the ECC decoder 514-2.

Upon receiving the ERR decoded codeword from the ERR decoder 512-2, the ECC decoder 514-2 can perform an error correction decode operation on the codeword, which comprises the user data read from memory 510 along with the decoded (e.g., corrected) ERR data. The error correction decode operation can include the ECC decoder 514-2 using the ECC parity bits with which the user data and ERR data were encoded via ECC encoder 514-1 to correct any incorrect bits within the codeword. Since the ERR data of the codeword has already been corrected, the effective BER associated with the codeword is reduced. For instance, the number of bit errors within the ERR decoded codeword will have been reduced as compared to if the codeword had not previously undergone the ERR decode operation. Reducing the number of bit errors within the codeword can reduce the likelihood of an uncorrectable ECC error by providing the ECC decoder 514-2 an improved likelihood of being able to correct all of the incorrect bits within the user data portion of the codeword.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of operating memory, comprising:
   adding, via a controller, an amount of error rate reduction (ERR) data to an amount of received user data such that the amount of ERR data replaces a portion of the amount of received user data that would have been within a codeword absent the replacement, wherein the amount of ERR data added to the amount of received user data is determined based, at least partially, on a desired amount of bit error rate reduction;
   writing, via the controller, the amount of user data along with the amount of ERR data to a memory, wherein the amount of ERR data comprises a plurality of portions of the amount of ERR data interspersed among the amount of user data such that at least one of the plurality of portions of the amount of ERR data is located between two portions of the amount of user data;
encoding the amount of ERR data and the amount of user data with error correction code (ECC) data prior to writing the amount of user data along with the amount of ERR data to the memory;
writing the amount of user data along with the amount of ERR data and the ECC data to the memory as the codeword;
reading the codeword from the memory; and
prior to performing an ECC decode operation on the amount of user data and the amount of ERR data read from the memory:
 determining those data units of the amount of ERR data that are incorrect; and
 correcting those data units of the amount of ERR data determined to be incorrect.

2. The method of claim 1, wherein the amount of ERR data is a known amount, and wherein adding the known amount of ERR data to the amount of received user data includes evenly distributing the known amount of ERR data among the amount of received user data.

3. The method of claim 2, wherein each data unit of the amount of ERR data has a same binary data value.

4. The method of claim 1, wherein the method includes determining the amount of ERR data based, at least partially, on:
 an error correction capability of the controller; and
 a determined bit error rate (BER) of the memory.

5. The method of claim 1, wherein a sum of the amount of ERR data and the amount of user data corresponds to a page size of the memory, and wherein the amount of ERR data is determined as a particular percentage of the page size.

6. The method of claim 1, wherein the method includes performing the ECC decode operation on the amount of user data and the corrected amount of ERR data read from the memory.

7. The method of claim 6, wherein the method includes, subsequent to performing the ECC decode operation on the amount of user data and the corrected amount of ERR data read from the memory, removing the ECC decoded amount of ERR data from the ECC decoded amount user data prior to transferring the ECC decoded amount of user data to a host.

8. An apparatus, comprising:
a memory; and
a controller configured to:
 determine an amount of error rate reduction (ERR) data to be replaced with a portion of an amount of received user data based on a desired amount of bit error rate reduction;
 add an amount of error rate reduction (ERR) data to an amount of received user data prior to writing the amount of ERR data and the amount of user data to the memory such that the amount of ERR data replaces a portion of the amount of received user data that would have been within a codeword absent the replacement, wherein the amount of ERR data comprises a plurality of portions of the amount ERR data interspersed among the amount of user data such that at least one of the plurality of portions of the amount of ERR data is located between two portions of the amount of user data; and
 prior to performing an error correction operation on the amount of user data:
  determine those data units of the amount of ERR data that are incorrect; and
  correct those data units of the amount of ERR data determined to be incorrect.

9. The apparatus of claim 8, wherein the controller is configured to write the amount of ERR data and the amount of user data to the memory as a page of data, the page of data having a particular page size, and wherein adding the amount of ERR data to the amount of user data reduces an amount of user data corresponding to the page of data such that the particular page size is maintained.

10. The apparatus of claim 8, wherein the amount of ERR data is a plurality of data units having known data values.

11. An apparatus, comprising:
a memory; and
a controller configured to:
 add a determined amount of error rate reduction (ERR) data to an amount of received user data such that the amount of ERR data replaces a portion of the amount of received user data that would have been within a codeword absent the replacement, wherein the amount of ERR data comprises a plurality of portions of the amount ERR data interspersed among the amount of user data such that at least one of the plurality of portions of the amount of ERR data is located between two portions of the amount of user data;
 write the determined amount of ERR data and the amount of user data along with corresponding error correction data to the memory as the codeword;
 read the codeword from the memory;
 prior to using the error correction data to perform an error correction operation on the amount of user data and the amount of ERR data:
  determine those data units of the amount of ERR data that are incorrect; and
  correct those data units of the amount of ERR data determined to be incorrect; and
 perform, using the error correction data, the error correction operation on the amount of user data and the corrected amount of ERR data.

12. The apparatus of claim 11, wherein the controller comprises:
an ERR encoder configured to add the determined amount of ERR data to the amount of user data; and
an ERR decoder configured to determine those data units of the amount of ERR data that are incorrect and correct those data units of the amount of ERR data determined to be incorrect.

13. The apparatus of claim 11, wherein the controller is configured to determine the amount of ERR data based on a bit error rate of at least a portion of the memory to which the codeword is written.

14. The apparatus of claim 11, wherein the error correction data comprises parity bits.

15. The apparatus of claim 11, wherein the error correction data includes a low-density parity-check (LDPC) code.

16. The apparatus of claim 11, wherein the error correction data includes an error correction code (ECC) selected from the group comprising:
a Bose, Chaudhuri, and Hocquenghem (BCH) code; and
a Reed-Solomoon (RS) code.

17. The apparatus of claim 11, wherein the controller is configured to determine the amount of ERR data based, at least partially, on a page size of the memory.

18. The apparatus of claim 11, wherein the controller is configured to add the determined amount of ERR data to the amount of received user data such that the ERR data is distributed evenly among the amount of received user data.

19. An apparatus of claim 11, wherein a sum of the amount of user data and the amount of ERR data is equal to a page size of the memory.

* * * * *